United States Patent
Tounai

[11] Patent Number: 5,871,874
[45] Date of Patent: Feb. 16, 1999

[54] MASK PATTERN FORMING METHOD CAPABLE OF CORRECTING ERRORS BY PROXIMITY EFFECT AND DEVELOPING PROCESS

[75] Inventor: Keiichiro Tounai, Tokyo, Japan

[73] Assignee: NEC Corporation, Tokyo, Japan

[21] Appl. No.: 917,756

[22] Filed: Aug. 27, 1997

[30] Foreign Application Priority Data

Aug. 28, 1996 [JP] Japan .................................. 8-226582

[51] Int. Cl.$^6$ ................................ G03F 9/00; G03C 5/00
[52] U.S. Cl. ............................................ 430/30; 430/296
[58] Field of Search ....................................... 430/30, 296

[56] References Cited

FOREIGN PATENT DOCUMENTS 4-179952  6/1992  Japan .
6-45424   2/1994  Japan .

Primary Examiner—Christopher G. Young
Attorney, Agent, or Firm—Whitham, Curtis & Whitham

[57] ABSTRACT

In a method for forming a mask pattern which is exposed with light or electrons, a resist layer being exposed with light or electrons passed through said mask pattern to form a resist pattern, a light or electron beam intensity on the resist layer is calculated. Then, a deviation of a logarithmic value of the light intensity is calculated, and a ratio of a logarithmic value of a dissolving speed of the resist layer to a logarithmic value of the exposure is calculated. Then, a value is calculated by $a^{1/b} \cdot I$ where a is the deviation, b is the ratio, I is the intensity. Then, a size of the resist pattern is calculated by setting a contour having a predetermined value in a distribution of the value, and a difference between the mask pattern and the size of the resist pattern is calculated. Finally, the mask pattern is corrected in accordance with the difference.

6 Claims, 13 Drawing Sheets

MASK PATTERN FORMING METHOD CAPABLE OF CORRECTING ERRORS BY PROXIMITY EFFECT AND DEVELOPING PROCESS

BACKGROUND OF THE INVENTION

1. Field of the Invention

The present invention relates to a method for forming a mask pattern in a semiconductor manufacturing process, and more particularly, to the improvement of a method for correcting the mask pattern.

2. Description of the Related Art

Recently, as semiconductor devices have been very fine-structure a, the errors of a photoresist pattern caused by the optical proximity effect of a light exposure system and the developing process cannot be ignored.

In a first prior art mask pattern forming method (see JP-A-4-179952), a light intensity on a photoresist layer with respect to a position is calculated. Then, a correction amount of the position is calculated by determining whether or not the light intensity reaches a definite value. Then, the dimension of the pattern of the pattern mask is corrected in accordance with the correction amount. This will be explained later in detail.

Thus, in the first prior art mask pattern forming method, an error of a photoresist pattern due to the optical proximity effect can be corrected. However, since no consideration is given to a developing process of the photoresist layer, a change of a photoresist pattern due to the change of a light intensity distribution by the developing process of the photoresist layer cannot be corrected.

In a second prior art mask pattern forming method (see JP-A-6-45424), a relationship between a dissolving speed and an exposure with respect to a depth position of a photoresist layer are experimentally obtained in advance. First, light intensity for points of the photoresist layer is calculated to obtain an exposure distribution. Then, a dissolving speed of each point within the photoresist layer is calculated by using this relationship, and thus, a dissolving speed distribution within the photoresist layer is obtained. Then, a developing time (dissolving time) of each point within the photoresist layer is calculated by using the dissolving speed distribution, and thus, a developing time distribution within the photoresist layer is obtained. Then, a photoresist pattern is calculated by setting a time contour having the same time as the developing time distribution. Then, the dimension of the pattern of the pattern mask is corrected in accordance with the calculated photoresist pattern. This will be explained later in detail.

Thus, in the second prior art mask pattern forming method, a change of a photoresist pattern due to the change of a light intensity distribution by the developing process of the photoresist layer can be corrected. However, since a dissolving speed and a developing time are calculated for each point of the photoresist layer, a large amount of calculating time is required.

SUMMARY OF THE INVENTION

It is an object of the present invention to provide a fast mask pattern forming method capable of correcting errors caused by the proximity effect and a developing process.

According to the present invention, in a method for forming a mask pattern which is exposed with light or electrons, a resist layer being exposed with light or electrons passed through said mask pattern to form a resist pattern, a light or electron beam intensity on the resist layer is calculated. Then, a deviation of a logarithmic value of the light intensity is calculated, and a ratio of a logarithmic value of a dissolving speed of the resist layer to a logarithmic value of the exposure is calculated. Then, a value is calculated by $a^{1/b} \cdot I$ where a is the deviation, b is the ratio, I is the intensity. Then, a size of the resist pattern is calculated by setting a contour having a predetermined value in a distribution of the value, and a difference between the mask pattern and the size of the resist pattern is calculated. Finally, the mask pattern is corrected in accordance with the difference.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, prior art mask pattern forming methods will be explained with reference to FIGS. 1, 2, 3, 4 and 5.

Figure 1:
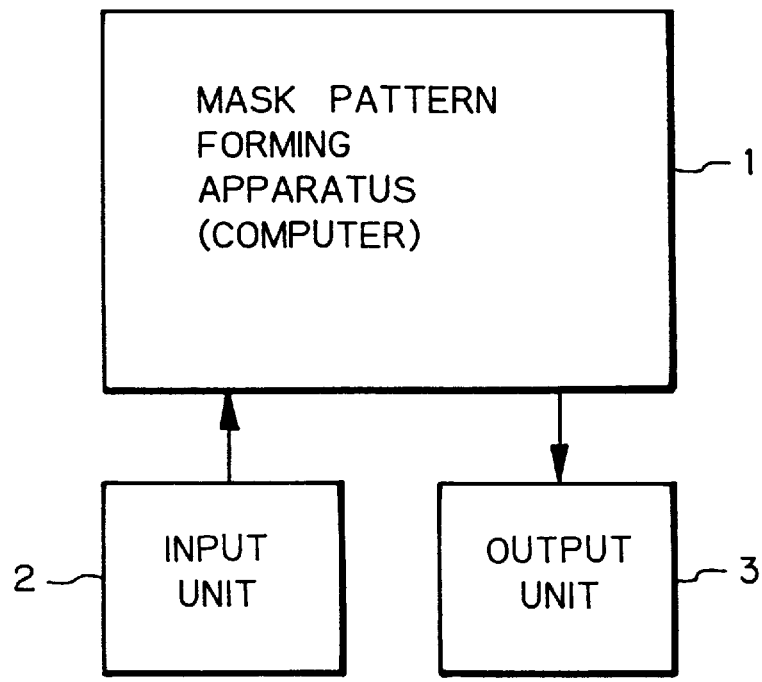
FIG. 1 is a block circuit diagram illustrating a prior art mask pattern forming system.

In FIG. 1, which illustrates a prior art mask pattern forming system, reference numeral 1 designates a mask pattern forming apparatus such as a computer, 2 designates an input unit for inputting initial values, and 3 designates an output unit for outputting a calculated mask pattern. The mask pattern forming apparatus 1 is formed by a central processing unit (CPU), a read-only memory (ROM), a random access memory (RAM), and the like.

Figure 2:
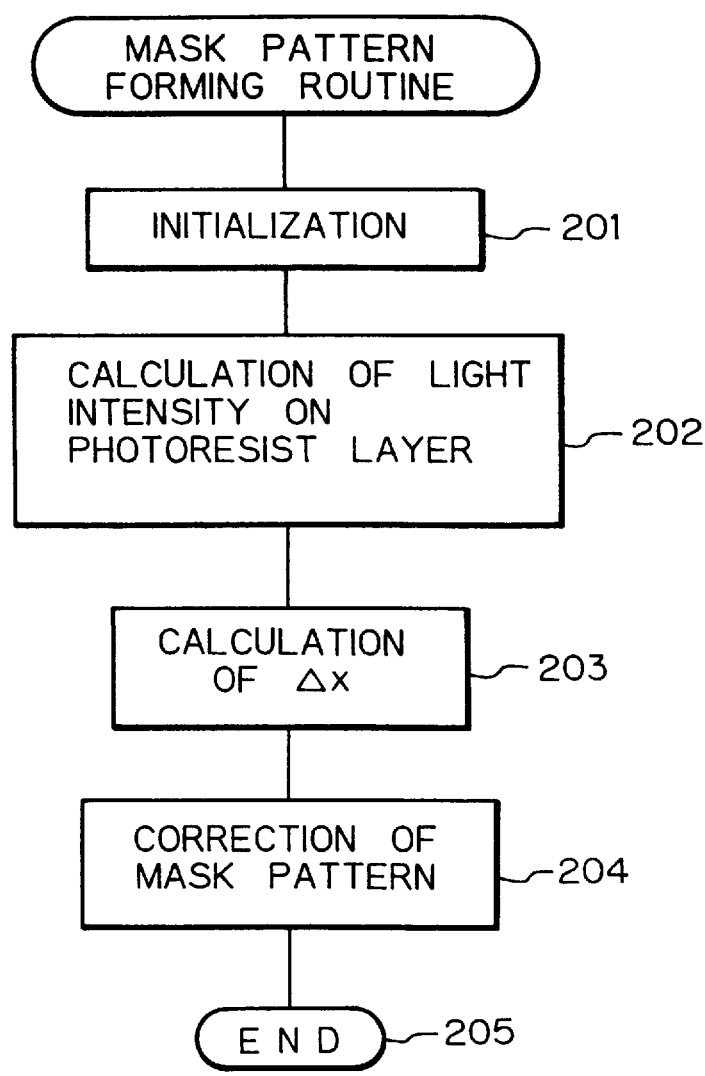
FIG. 2 is a flowchart illustrating a first prior art mask pattern forming method.

FIG. 2 is a flowchart illustrating a first prior art mask pattern forming method whose operation is carried out by the mask pattern forming apparatus of FIG. 1 (see JP-A-4-179952). In the first prior art mask pattern forming method, assume that a pattern mask is exposed with a light, and a photoresist layer is exposed with the light penetrating the mask pattern.

First, at step 201, an initialization is carried out. For example, initial mask patterns are input from the input unit 2 to the mask pattern forming apparatus 1.

Figure 3:
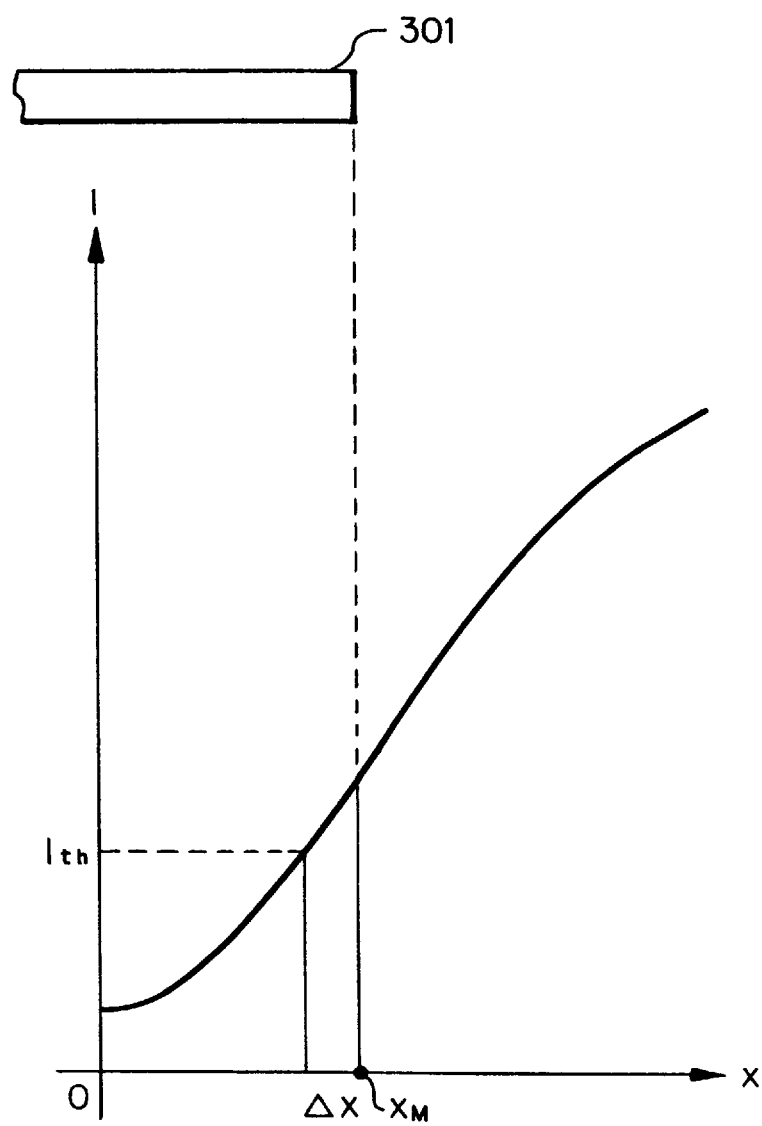
FIG. 3 is a graph showing a light intensity distribution for explaining the flowchart of FIG. 2.

Next, at step 202, a light intensity I on the photoresist layer with respect to a position x is calculated as shown in FIG. 3. Note that the position $x_M$ indicates an edge of a pattern of a pattern mask 301.

Next, at step 203, a correction amount $\Delta x$ of the position $x_M$ is calculated by determining whether or not the light intensity I reaches a definite value $I_{th}$.

Next, at step 204, the dimension of the pattern of the pattern mask is corrected in accordance with the correction amount $\Delta x$. That is, $$X_M \leftarrow X_M - \Delta x$$

All the corrected mask patterns are output to the output unit 3 as occasion demands.

Then, the routine of FIG. 2 is completed by step 204.

Thus, in the first prior art mask pattern forming method, an error of a photoresist pattern due to the optical proximity effect can be corrected.

In the first prior art mask pattern method, however, since no consideration is given to a developing process of the photoresist layer, a change of a photoresist pattern due to the change of a light intensity distribution by the developing process of the photoresist layer cannot be corrected.

Figure 4:
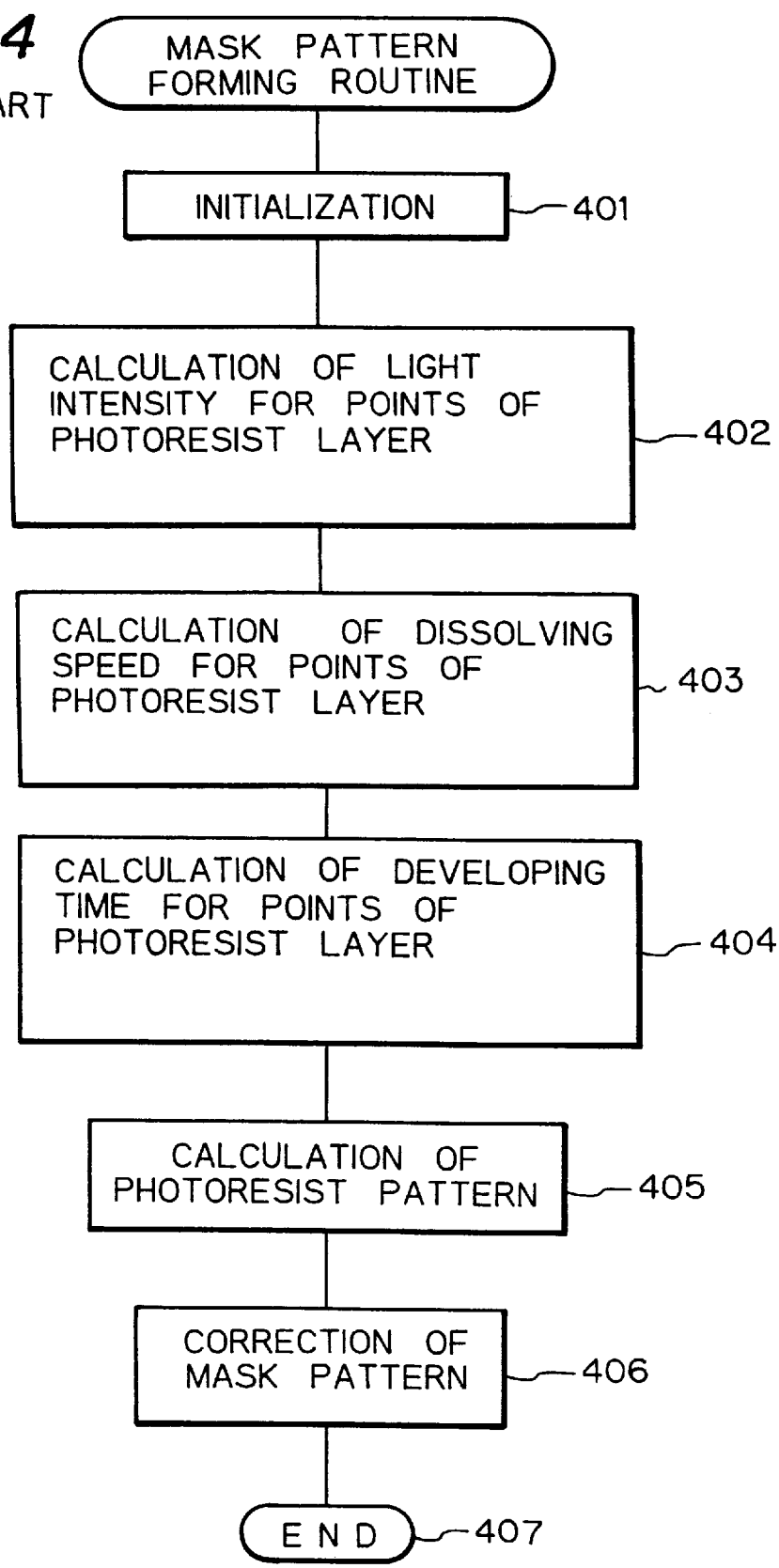
FIG. 4 is a flowchart illustrating a second prior art mask pattern forming method.

FIG. 4 is a flowchart illustrating a second prior art mask pattern forming method whose operation is carried out by the mask pattern forming apparatus of FIG. 1 (see JP-A-6-45424). Also, in the first prior art mask pattern forming method, assume that a pattern mask is exposed with a light, and a positive photoresist layer is exposed with the light penetrating the mask pattern.

Figure 5:
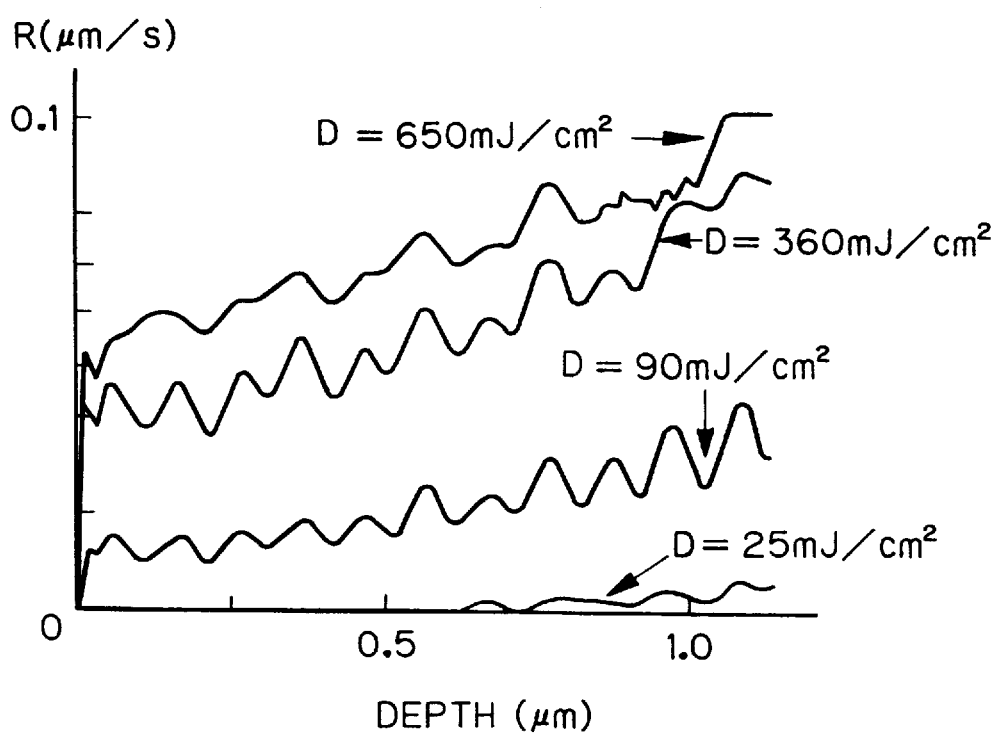
FIG. 5 is a graph showing a dissolving speed distribution for explaining the flowchart of FIG. 4.

First, at step 401, an initialization is carried out. For example, initial mask patterns are input from the input unit 2 to the mask pattern forming apparatus 1. In addition, a relationship between a dissolving speed R and an exposure D with respect to a depth position of the photoresist layer are experimentally obtained as shown in FIG. 5, and this relationship is input from the input unit 2 to the mask pattern forming apparatus 1. Note that, since light is absorbed in the photoresist layer and light incident to the photoresist layer interferes with light reflected from a substrate on which the photoresist layer is formed, the above-mentioned relationship is substantially changed in accordance with the depth position of the photoresist.

Next, at step 402, a light intensity for points for the photoresist layer is calculated to obtain an exposure distribution.

Next, at step 403, a dissolving speed of each point within the photoresist layer is calculated by using the relationship as shown in FIG. 5 Thus, a dissolving speed distribution within the photoresist layer is obtained.

Next, at step 404, a developing time (dissolving time) of each point within the photoresist layer is calculated by using the dissolving speed distribution calculated by step 403. Thus, a developing time distribution within the photoresist layer is obtained.

Next, at step 405, a photoresist pattern is calculated by setting a time contour having the same time in the developing time distribution.

Next, at step 406, the dimension of the pattern of the pattern mask is corrected in accordance with the calculated photoresist pattern.

All the corrected mask patterns are output to the output unit 3 as occasion demands.

Then, the routine of FIG. 4 is completed by step 406.

Thus, in the second prior art mask pattern forming method, a change of a photoresist pattern due to the change of a light intensity distribution by the developing process of the photoresist layer can be corrected.

In the second prior art mask pattern forming method, however, since a dissolving speed and a developing time are calculated for each point of the photoresist layer, a large amount of calculating time is required. Particularly, when calculating a three-dimensional photoresist pattern, a much larger amount of calculating time is required.

The principle of the present invention will be explained next with reference to FIGS. 6, 7 and 8.

Figure 6:
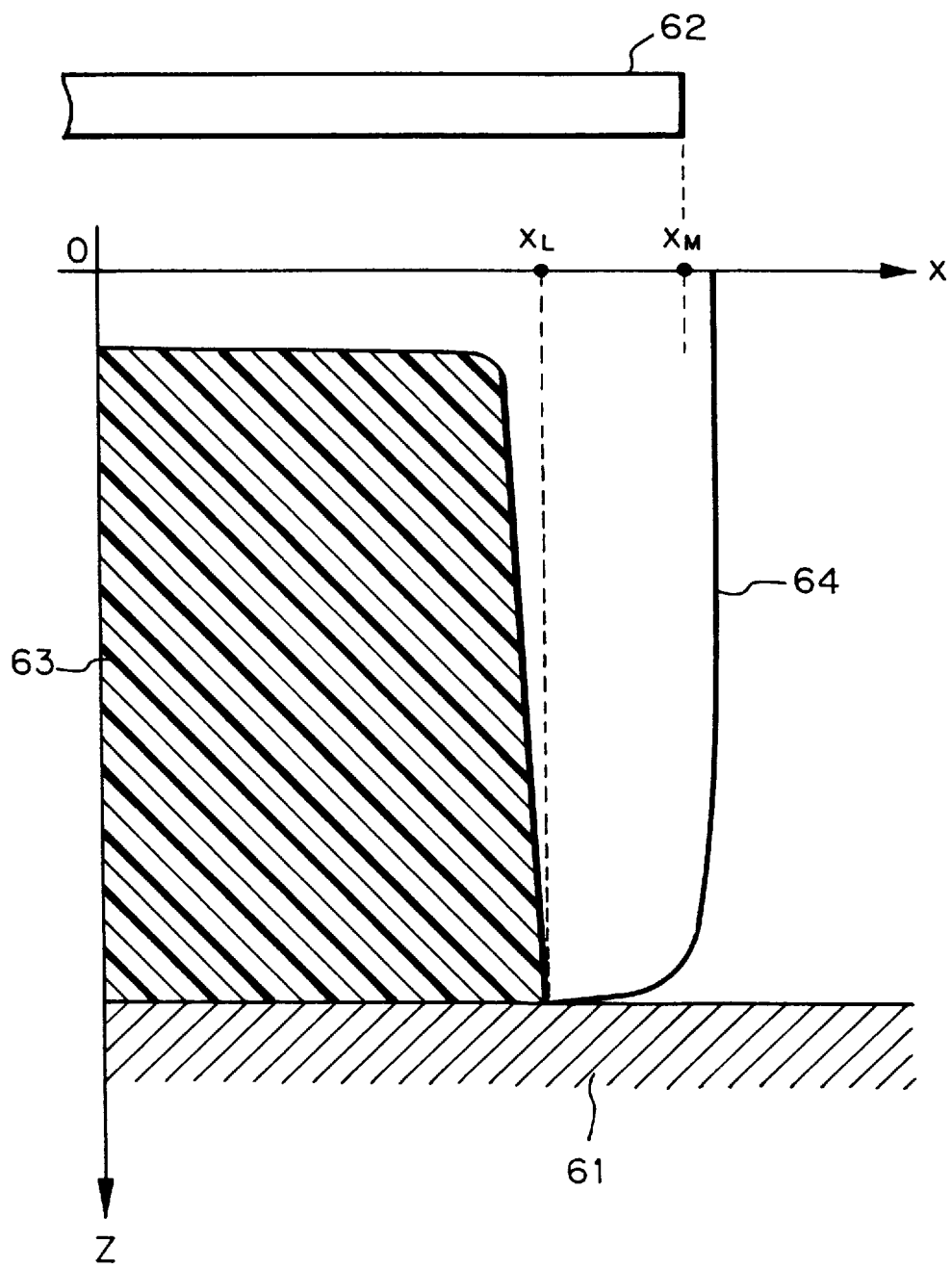
FIG. 6 is a cross-sectional view illustrating a photoresist pattern after development and a development proceeding path for explaining the principle of the present invention.

In FIG. 6, which is a cross-sectional view illustrating a photoresist pattern after development and a development proceeding path, a photoresist layer is formed on a substrate 61, and the photoresist layer is developed by a mask pattern 62 to form a photoresist pattern 63. Usually, the bottom of the photoresist pattern 63 is not smaller than the top of the photoresist pattern 63. Therefore, the bottom of the photoresist pattern 63 is important and is monitored.

In FIG. 6, a position $x_L$ indicates an edge of the bottom of the photoresist pattern 63. In this case, a development proceeds along a development proceeding path 64 which is perpendicular to the surface of the photoresist layer while the photoresist layer is developed. Note that the development proceeding path reaches the edge of the bottom of the photoresist pattern 63.

Figure 7:
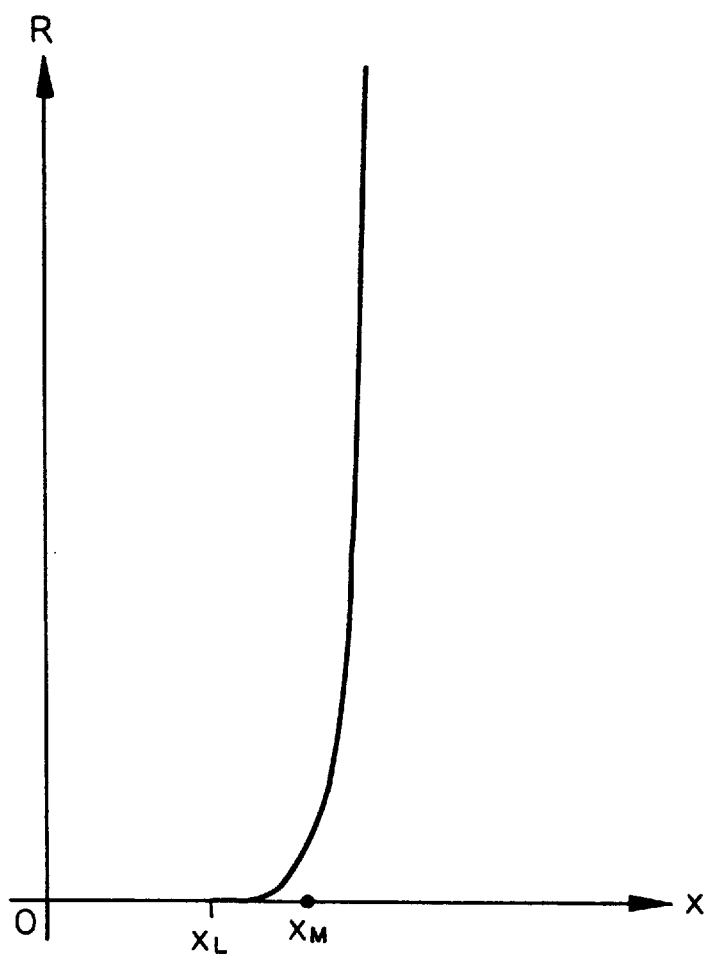
FIG. 7 is a graph showing the dissolving speed of the photoresist pattern along the development proceeding path of FIG. 6.

In FIG. 7, which shows a dissolving speed R of the photoresist pattern 63 along the development proceeding line 64 of FIG. 6, the dissolving speed R is very small around the edge of the bottom of the photoresist pattern 63 below the edge of the mask pattern 62. In view of this, in the present invention, the dissolving process around the bottom of the photoresist pattern 63 is focused.

Figure 8:
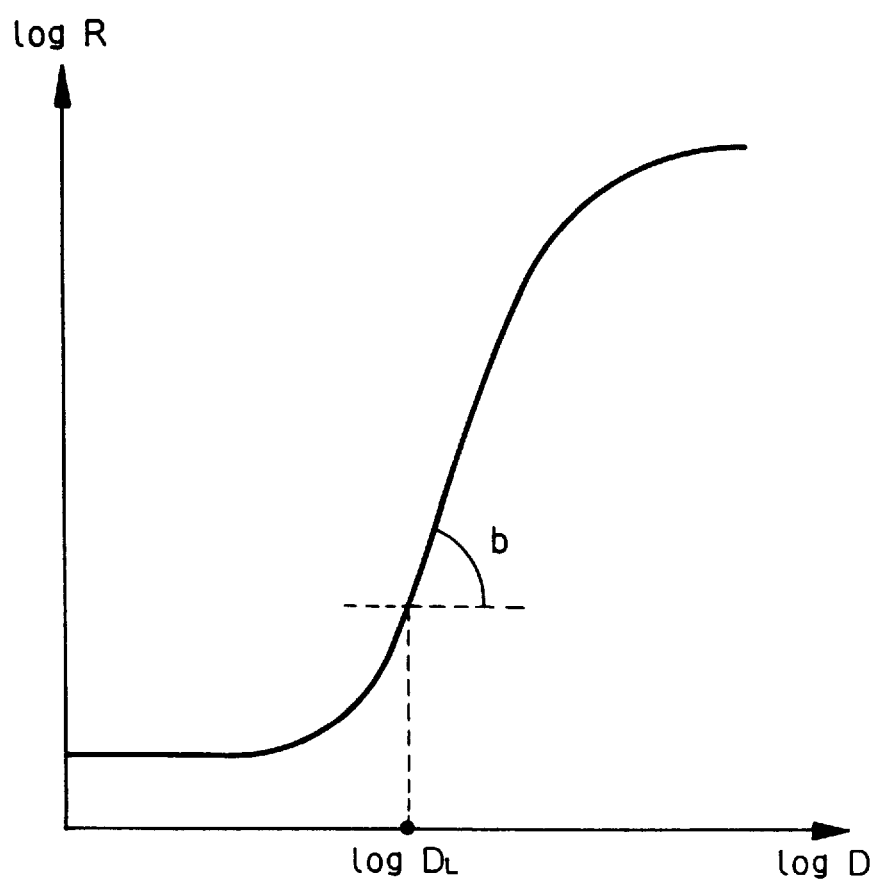
FIG. 8 is a graph showing a relationship between the exposure and the dissolving speed of the photoresist pattern of FIG. 6.

In FIG. 8, which illustrates a relationship between the dissolving speed R and the exposurs D in a chemical amplification type positive photoresist layer, this relationship can be measured. Generally, the light intensity I can be calculated from a set light intensity in view of light absorption of the photoresist layer and interference with light reflected from the substrate 61 of FIG. 6. Particularly, if a photoresist layer having a high performance is used, a linear relationship between the logarithmic value of the light intensity I and the logarithic value of the dissolving time R is exhibited around the edge of the mask pattern 62 of FIG. 6. That is, $$\Delta(\log R)/\Delta(\log D) = b(\text{definite value}) \qquad (1)$$

On the other hand, as shown in FIG. 3, the light intensity I has a large slope around the edge of the mask pattern. Therefore, "a" is defined by a slope of the logarithmic value of the light intensity I around the bottom of the photoresist pattern, i.e., then $$a = \Delta(\log I)/\Delta x \qquad (2)$$

Thus, in the present invention, under the condition that the values "a" and "b" are both large, the dimension of the mask pattern is corrected by using a value of $a^{1/b} \cdot I$.

Figure 9:
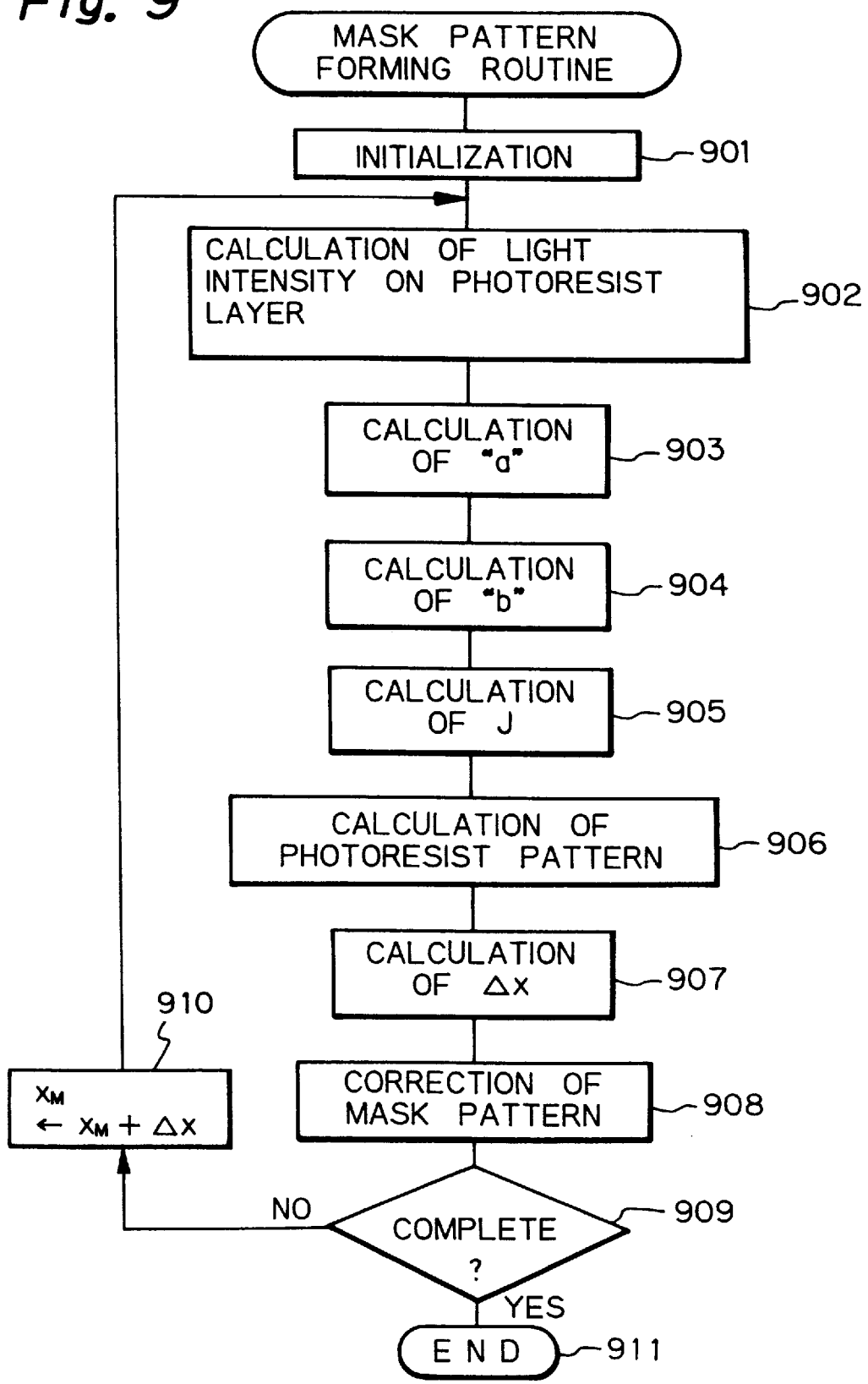
FIG. 9 is a flowchart illustrating an embodiment of the mask pattern forming method according to the present invention.

FIG. 9 is a flowchart illustrating an embodiment of the mask pattern forming method according to the present invention whose operation is also carried out by the mask pattern forming apparatus of FIG. 1. In FIG. 9, assume that a pattern mask is exposed with a light, and a photoresist layer is exposed with the light penetrating the mask pattern.

First, at step 901, an initialization is carried out. For example, initial mask patterns are input from the input unit 2 to the mask pattern forming apparatus 1.

Figure 10:
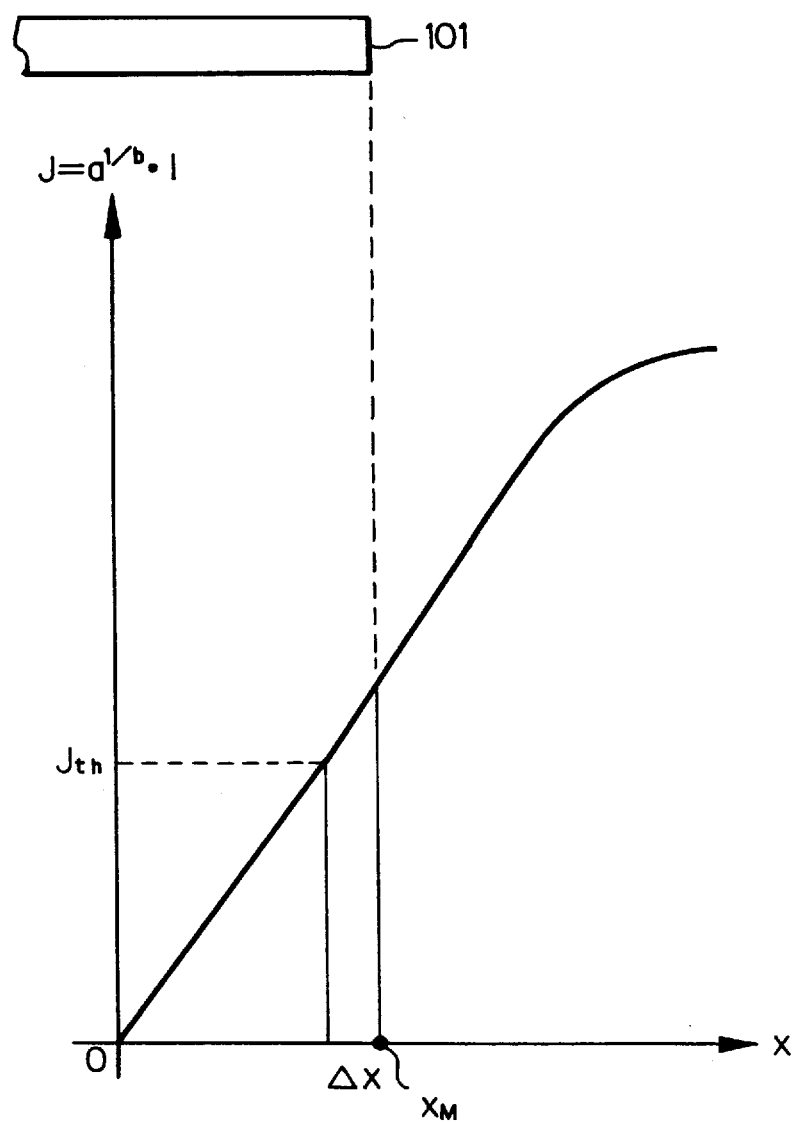
FIG. 10 is a graph showing a light intensity distribution for explaining the flowchart of FIG. 9.

Next, at step 902, a light intensity I on the photoresist layer with respect to a position x is calculated as shown in FIG. 10. Note that the position $x_M$ indicates an edge of a pattern of a pattern mask 101.

Next, at step 903, a value "a" is calculated by using the formula (2) around the position $x_M$ as indicated in FIG. 10.

Next, at step 904, a value "b" is also calculated by using the formula (1) around the position $x_M$ as indicated in FIG. 10.

Next, at step 905, a value J for each value of I is calculated by $$J = a^{1/b} I$$

Thus, a distribution J is obtained.

Next, at step 906, a photoresist pattern is calculated by setting a contour having the same value of $J_{th}$ in the distribution J. Note that the value $J_{th}$ as is indicated in FIG. 10.

Next, at step 907, a correction amount Δx of the position $x_M$ is calculated by a difference between the edge position of the photoresist pattern and the edge position $x_M$ of the pattern mask 101 of FIG. 10.

Next, at step 908, the dimension of the pattern of the pattern mask is corrected in accordance with the correction amount Δx. That is, $$x_M \leftarrow x_M - \Delta x$$

Steps 909 and 910 repeat the control at steps 902 through 908 two or more times, thus obtaining a more accurate correction.

All the corrected mask patterns are output to the output unit 3 as occasion demands.

Then, the routine of FIG. 9 is completed by step 911.

Figure 11:
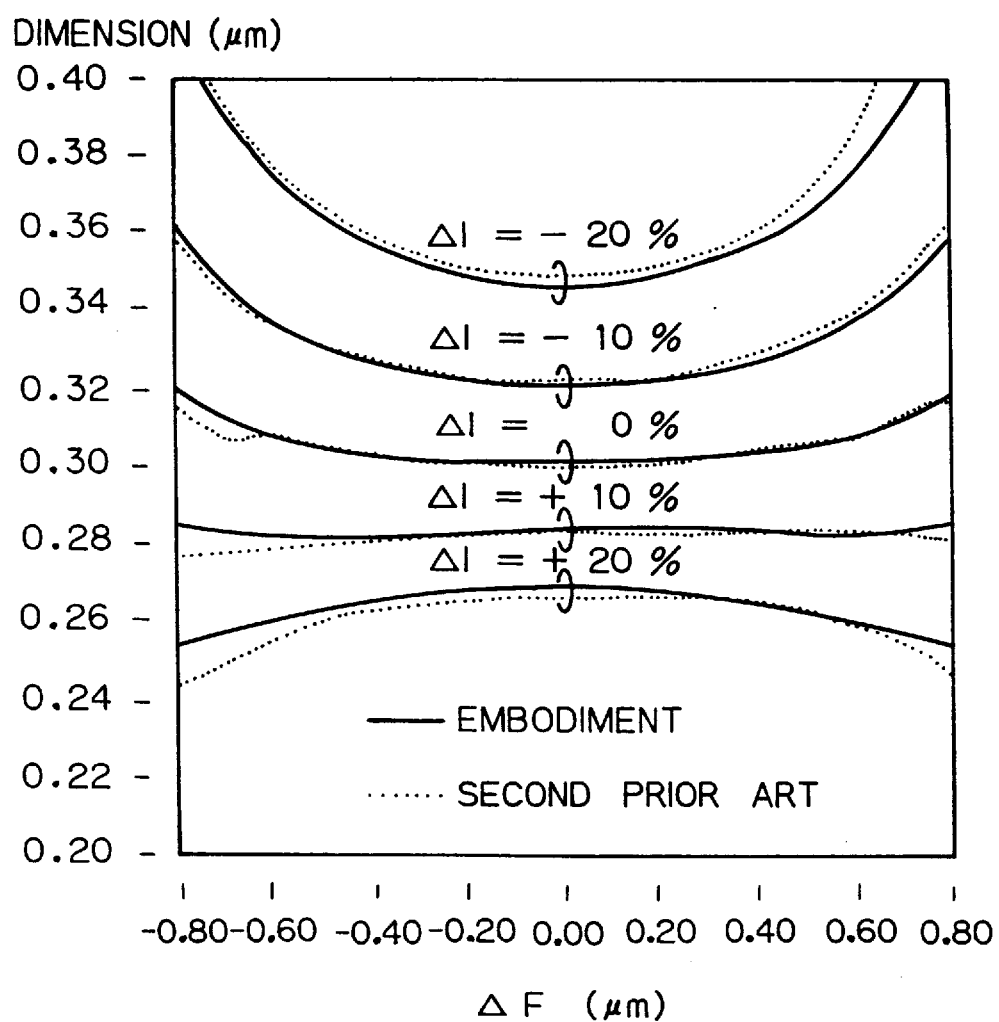
FIG. 11 is a graph for showing the effect of the present invention.
Figure 12:
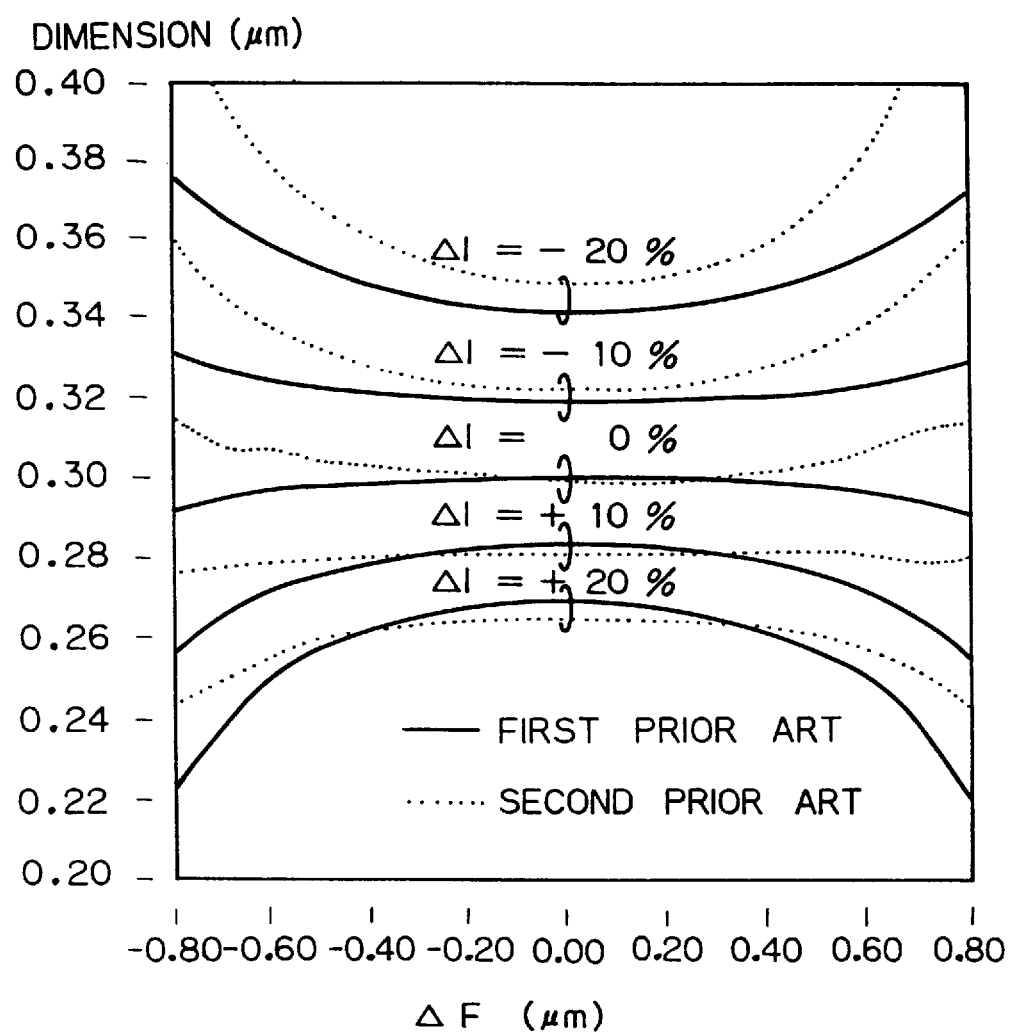
FIG. 12 is a graph for showing the effect of the first prior art mask pattern forming method of FIG. 2.

Thus, in the embodiment the calculating time can be remarkably reduced as compared with the second prior art mask pattern forming method. In addition, as illustrated in FIG. 11, the dimension of the photoresist pattern can be closer to an aimed value, as compared with the first prior art mask pattern forming method as illustrated in FIG. 12. In FIGS. 11 and 12, the aimed value is obtained by the second prior art mask pattern method. Also, in FIGS. 11 and 12, ΔF shows a focus. That is, if ΔF=0, this means a best focus state where the focus of an optical system is located at a height within of a photoresist layer to be developed. If ΔF is positive, the focus of the optical system is above the above-mentioned height, while, if ΔF is negative, the focus of the optical system is below the above-mentioned height.

Figure 13:
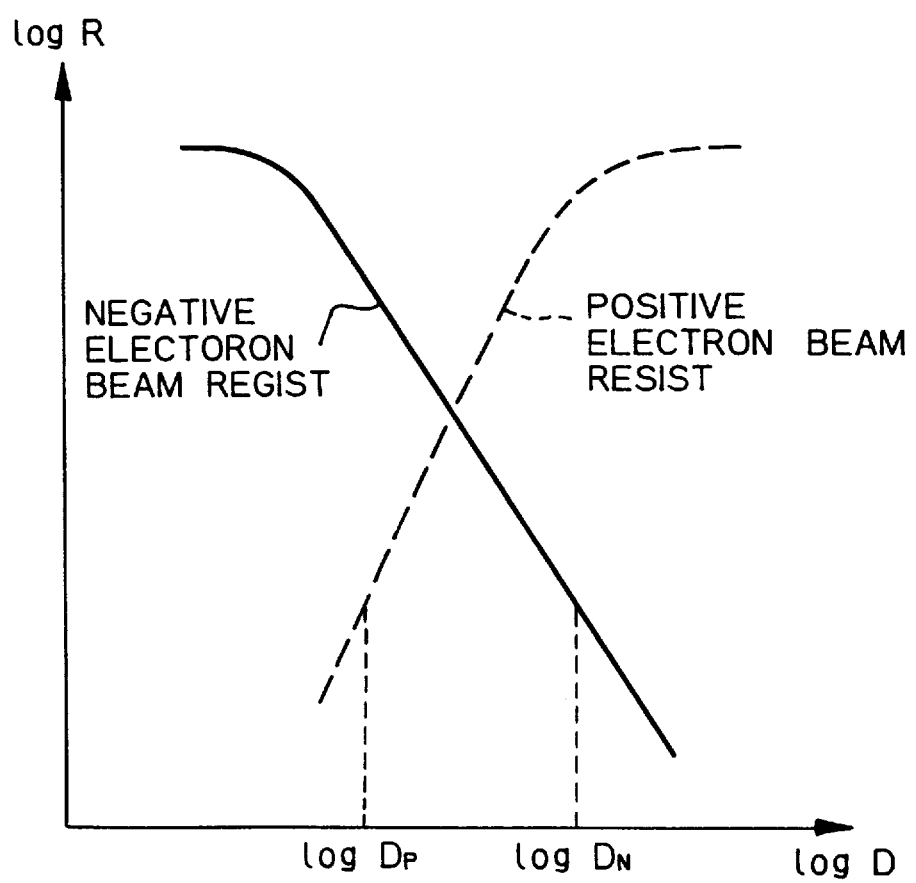
FIG. 13 is a graph showing a relationship between the exposure and the dissolving speed of an electron beam resist pattern.

The present invention can be applied to an electron beam resist layer. That is, as illustrated in FIG. 13, a relationship between a logarithmic value of an electron dose D and a logarithmic value of a dissolving speed R of positive and negative electron beam resist is linear. In addition, an electron exposure intensity is rapidly changed around the bottom of an electron beam resist pattern.

In the case of an electron beam resist pattern, I is an electron beam intensity, and correcting operation of a mask pattern at step 908 of FIG. 9 corrects exposure data stored in the RAM of the mask pattern forming apparatus 1.

As explained hereinabove, according to the present invention, the calculating time can be reduced while the size of a photoresist pattern or an electron beam resist pattern can be an aimed value in spite of a change of the light or electron beam intensity distribution in a developing process.

I claim:

1. A method for forming a mask pattern which is exposed with light, a photoresist layer being exposed with light passed through said mask pattern to form a photoresist pattern, comprising the steps of:

calculating a light intensity on said photoresist layer;

calculating a first value which is a deviation of a logarithmic value of said light intensity;

calculating a second value which is a ratio of a logarithmic value of a dissolving speed of said photoresist layer to a logarithmic value of said light intensity;

calculating a third value by $a^{1/b}$, I where a is said first value, b is said second value, I is said light intensity;

calculating a size of said photoresist pattern by setting a contour having a predetermined value in a distribution of said third value;

calculating a difference between said mask pattern and the size of said photoresist pattern; and correcting said mask pattern in accordance with said difference.

2. The method as set forth in claim 1, wherein said first and second values are calculated around an edge of said mask pattern.

3. The method as set forth in claim 1, further comprising a step of repeating operations of said light intensity calculating step, said first value calculating step, said second value calculating step, said third value calculating step, said photoresist pattern size alculating step, said difference calculating step and said correcting step, after said mask pattern is corrected.

4. A method for forming a mask pattern which is exposed with an electron beam, an electron beam resist layer being exposed with electrons passed through said mask pattern to form a electron beam resist pattern, comprising the steps of:

calculating an electron beam intensity on said electron beam resist layer;

calculating a first value which is a deviation of a logarithmic value of said electron beam intensity;

calculating a second value which is a ratio of a logarithmic value of a dissolving speed of said electron beam resist layer to a logarithmic value of said electron beam intensity;

calculating a third value by $a^{1/b}$–D where a is said first value, b is said second value, D is said electron beam intensity;

calculating a size of said electron beam resist pattern by setting a contour having a predetermined value in a distribution of said third value;

calculating a difference between said mask pattern and the size of said electron beam resist pattern; and correcting said mask pattern in accordance with said difference.

5. The method as set forth in claim 4, wherein said first and second values are calculated around an edge of said mask pattern.

6. The method as set forth in claim 4, further comprising a step of repeating operations of said electron beam intensity calculating step, said first value calculating step, said second value calculating step, said third value calculating step, said electron beam resist pattern size calculating step, said difference calculating step and said correcting step, after said mask pattern is corrected.

* * * * *